United States Patent
Yanoo

(10) Patent No.: US 9,626,458 B2
(45) Date of Patent: Apr. 18, 2017

(54) EVALUATION MODEL GENERATION DEVICE, EVALUATION MODEL GENERATION METHOD, AND EVALUATION MODEL GENERATION PROGRAM

(75) Inventor: Kazuo Yanoo, Tokyo (JP)

(73) Assignee: NEC CORPORATION, Tokyo (JP)

( * ) Notice: Subject to any disclaimer, the term of this patent is extended or adjusted under 35 U.S.C. 154(b) by 694 days.

(21) Appl. No.: 14/126,498

(22) PCT Filed: Jun. 4, 2012

(86) PCT No.: PCT/JP2012/003644
§ 371 (c)(1),
(2), (4) Date: Dec. 16, 2013

(87) PCT Pub. No.: WO2012/172747
PCT Pub. Date: Dec. 20, 2012

(65) Prior Publication Data
US 2014/0114639 A1  Apr. 24, 2014

(30) Foreign Application Priority Data

Jun. 14, 2011  (JP) ................................ 2011-132377

(51) Int. Cl.
*G06F 17/50* (2006.01)
*G06F 11/36* (2006.01)

(52) U.S. Cl.
CPC .......... *G06F 17/50* (2013.01); *G06F 11/3604* (2013.01)

(58) Field of Classification Search
USPC ..................... 703/22, 24; 709/395, 238, 228
See application file for complete search history.

(56) References Cited

U.S. PATENT DOCUMENTS 7,143,087 B2 *  11/2006  Fairweather ............ G06F 8/427
                                                  707/770
7,685,083 B2 *   3/2010  Fairweather ............ G06F 8/427
                                                  706/45
(Continued)

FOREIGN PATENT DOCUMENTS

JP      2001-318812 A     11/2001
JP      2004-318654 A     11/2004
(Continued)

OTHER PUBLICATIONS

Object Management Group, "UML Profile for MARTE: Modeling and Analysis of Real-Time Embedded Systems", version 1.0, doc No. formal/2009-11-02, Nov. 2009, pp. 119-136, 719-726.

(Continued)

*Primary Examiner* — Thai Phan

(57) ABSTRACT

An evaluation model generation device is provided to generate an evaluation model which evaluates the function or non-function of an IT system based on a system model including a process model which describes processing between processes on the IT system, a server model which describes a physical system configuration of the IT system, and allocations which represent correspondence relations between the elements in the process model and those in the server model. The evaluation model generation device includes: path enumeration means 110 which extracts a process path between processes in the process model, and a server path corresponding to the process path and located on the server model; allocation estimation means 120 which estimates the allocation based on the process path and the server path; and model conversion means 130 which converts the system model into the evaluation model using the process paths, the server paths, and the estimated allocations.

15 Claims, 10 Drawing Sheets

(56) References Cited

U.S. PATENT DOCUMENTS

2007/0112714 A1* 5/2007 Fairweather ............ G06F 8/427
　　　　　　　　　　　　　　　　　　　　　706/46
2010/0070448 A1* 3/2010 Omoigui ............. H01L 27/1463
　　　　　　　　　　　　　　　　　　　　　706/47

FOREIGN PATENT DOCUMENTS

| JP | 2005-327094 A | 11/2005 |
| JP | 2007-179165 A | 7/2007 |
| JP | 2007-188179 A | 7/2007 |
| JP | 2008-52312 A | 3/2008 |

OTHER PUBLICATIONS

Peter H. Feiler et al., "The Architecture Analysis & Design Language (AADL): An Introduction", Software Engineering Institute, Carnegie Mellon University, Technical Note, CMU/SEI-2006-TN-011, Feb. 2006, pp. 1-129.
Su-Young Lee et al.,"Dealing with AADL End-to-end Flow Latency with UML MARTE", INRIA Research Report, Jan. 2008, No. 6402, pp. 3-19.
Tsutomu Shu et al., "UML o Mochiita System Level Sekkei Shuho no Teian", DA Symposium 2002, Jul. 22, 2002, vol. 2002, No. 10, pp. 49-54.
Andrea D Ambrogio, "A Model Transformation Framework for the Automated Building of Performance Models from UML Models", Proceedings of the 5th international workshop on Software and performance, ACM, Jul. 14, 2005, pp. 75-86.
International Search Report for PCT Application No. PCT/JP2012/003644, mailed on Sep. 4, 2012.

* cited by examiner

| SOURCE OF ALLOCATION | DESTINATION OF ALLOCATION |
|---|---|
| client | CLIENT |
| www | WEBSV |
| db | DBSV |

FIG. 7

| PROCESS PATH | POST-ALLOCATION REPLACEMENT PATH | SERVER PATH |
|---|---|---|
| client→m1→www | CLIENT→WEBSV | CLIENT→ROUTER→SW→WEBSV |
| www→m2→branch→m3→db | WEBSV→DBSV | WEBSV→SW→DBSV |

FIG. 8

| SOURCE OF ALLOCATION | DESTINATION OF ALLOCATION |
|---|---|
| client | CLIENT |
| www | WEBSV |
| db | DBSV |
| m1 | ROUTER |
| m1 | SW |
| m2 | SW |
| branch | SW |
| m3 | SW |
| m4 | SW |
| merge | SW |

EVALUATION MODEL GENERATION DEVICE, EVALUATION MODEL GENERATION METHOD, AND EVALUATION MODEL GENERATION PROGRAM

This application is a National Stage Entry of PCT/JP2012/003644 filed on Jun. 4, 2012, which claims priority from Japanese Patent Application 2011-132377 filed on Jun. 14, 2011, the contents of all of which are incorporated herein by reference, in their entirety.

TECHNICAL FIELD

The present invention relates to an evaluation model generation device, an evaluation model generation method, and an evaluation model generation program capable of reducing the number of man-hours required for describing evaluation models.

BACKGROUND ART

Upon design of an IT system, it is necessary to evaluate and verify whether the design satisfies functional and non-functional requirements (performance, availability, etc.). The methods and techniques for modeling the target system to be evaluated and implementing its functions and non-functions have long been studied. Recently, there have been proposed methods for describing the configuration and behavior of a system in UML (Unified Modeling Language), SysML (Systems Modeling Language) or like modeling language and evaluating the non-functional requirements (NFR) of the system. Because UML adopts drawings as the way of describing models, the language is easy for system engineers (SE) to understand and is appreciably conducive to being used in modeling. SysML is an extended language of UML for system modeling.

There exist methods (e.g., see Patent Literature 1, 2, 3) which, based on the system behavior described by sequence charts and activity charts in UML, automatically generate a queuing model for example. There are also methods (e.g., Patent Literature 4) of simulating the operation of an SoC (System on a Chip) by carrying out performance evaluation using an automatically generated performance evaluation model.

Where an IT system is to be modeled, it is preferred that the hardware configuration (called the server model hereunder) and the software configuration and behavior (called the process model hereunder) be defined separately. That is because the process model and the server model can be designed independently of each other. In fact, the server model and the process model are frequently defined separately. Also, when the server model and the process model are handled separately, the system model is modularized into the server model and the process model so that each model can be managed with ease.

The server model represents the hardware configuration and specifications of the servers involved and the connection relations between the servers on a network, among others. Sometimes, the OS and middleware running on the servers may be included in the server model. The process model describes the behavior between processes such as data exchanges, in addition to the connection relations between the processes. Information indicating which process is executed on which server is described in the form of correspondence relations (called allocations hereunder) between the elements in the process model and those in the server model.

The method of describing the server model and process model separately as outlined above has been practiced with MARIE (Modeling and Analysis of Real-Time and Embedded Systems) (see Non-Patent Document 1) and in AADL (Architecture Analysis and Design Language) (see Non-Patent Document 2), among others. This description method is also adopted by the technique described in Patent Document 3. MARIE is defined as the extended attributes (profile) of UML for evaluating the non-functional requirements of performance, for example. AADL is a modeling language having the function of evaluating non-functional requirements. As with UML, AADL is capable of modeling the system in an easily understandable manner using drawings.

CITATION LIST

Patent Literature

Patent Literature 1: JP-A-2001-318812
Patent Literature 2: JP-A-2007-179165
Patent Literature 3: JP-A-2007-188179
Patent Literature 4: JP-A-2005-327094

Non-Patent Literature

Non-Patent Literature 1:
Object Management Group, UML Profile for MARIE: Modeling and Analysis of Real-Time Embedded Systems, November 2009
Non-Patent Literature 2:
Peter H. Feiler, David P. Gluch, John J. Hudak, The Architecture Analysis & Design Language (AADL): An Introduction, February 2006
Non-Patent Literature 3:
Su-Young Lee, Mallet, F., de Simone, R., Dealing with AADL End-to-end Flow Latency with UML MARIE Engineering of Complex Computer Systems, 2008. ICECCS 2008. 13th IEEE International Conference on, January 2008

SUMMARY OF INVENTION

Technical Problem

Where the server model and the process model are described separately, the description of allocations can be troublesome. FIG. 14 is an explanatory view showing an example of modeling with MARIE described in Non-Patent Literature 3. In FIG. 14, the inside of a rectangle indicated as "non-cyclic processing" denotes the process model; the inside of a rectangle indicated as "execution platform" represents the server model; the inside of a rectangle indicated as "flow" stands for the processing of the process model; and dotted-line arrows furnished with an attribute "<<allocate>>" each denote the allocations between the elements.

In describing allocations during modeling with MARIE as shown in FIG. 14, the designer identifies the elements of the process model and those of the server model by which to execute each of the steps constituting the process model while understanding the CPU and bus structures in the server model. The description of the allocations involving these complex steps can be troublesome and tends to incur errors.

It is therefore an object of the present invention to provide an evaluation model generation device, an evaluation model generation method, and an evaluation model generation program capable of reducing the amount of the allocations described when a system is modeled hierarchically into a server model and a process model using UML or like modeling language.

Solution to Problem

According to the present invention, there is provided an evaluation model generation device for generating an evaluation model which evaluates the function or non-function of an IT system based on a system model including a process model which describes processing between processes on the IT system, a server model which describes a physical system configuration of the IT system, and allocations which represent correspondence relations between the elements in the process model and those in the server model, the evaluation model generation device including: path enumeration means which extracts a process path between processes in the process model, and a server path corresponding to the process path and located on the server model; allocation estimation means which estimates the allocation based on the process path and the server path; and model conversion means which converts the system model into the evaluation model using the process paths, the server paths, and the estimated allocations.

According to the present invention, there is also provided an evaluation model generation method for generating an evaluation model which evaluates the function or non-function of an IT system based on a system model including a process model which describes processing between processes on the IT system, a server model which describes a physical system configuration of the IT system, and allocations which represent correspondence relations between the elements in the process model and those in the server model, the evaluation model generation method including the steps of: extracting a process path between processes in the process model, and a server path corresponding to the process path and located on the server model; estimating the allocation based on the process path and the server path; and converting the system model into the evaluation model using the process paths, the server paths, and the estimated allocations.

According to the present invention, there is also provided an evaluation model generation program for generating an evaluation model which evaluates the function or non-function of an IT system based on a system model including a process model which describes processing between processes on the IT system, a server model which describes a physical system configuration of the IT system, and allocations which represent correspondence relations between the elements in the process model and those in the server model, the evaluation model generation program causing a computer to execute a procedure including the processes of: extracting a process path between processes in the process model, and a server path corresponding to the process path and located on the server model; estimating the allocation based on the process path and the server path; and converting the system model into the evaluation model using the process paths, the server paths, and the estimated allocations.

Advantageous Effects of the Invention

According to the present invention, when a system is modeled hierarchically into a server model and a process model using UML or like modeling language, the amount of described allocations can be reduced, and errors in the allocation description can be diminished.

BRIEF DESCRIPTION OF DRAWINGS

FIG. 7 It depicts an explanatory view showing the correspondence relations between process paths, post-allocation replacement paths, and server paths.

FIG. 8 It depicts an explanatory view showing a typical allocation table including estimated allocations.

DESCRIPTION OF EMBODIMENTS

First Exemplary Embodiment

The first exemplary embodiment of the present invention is explained below in reference to the accompanying drawings.

Figure 1:
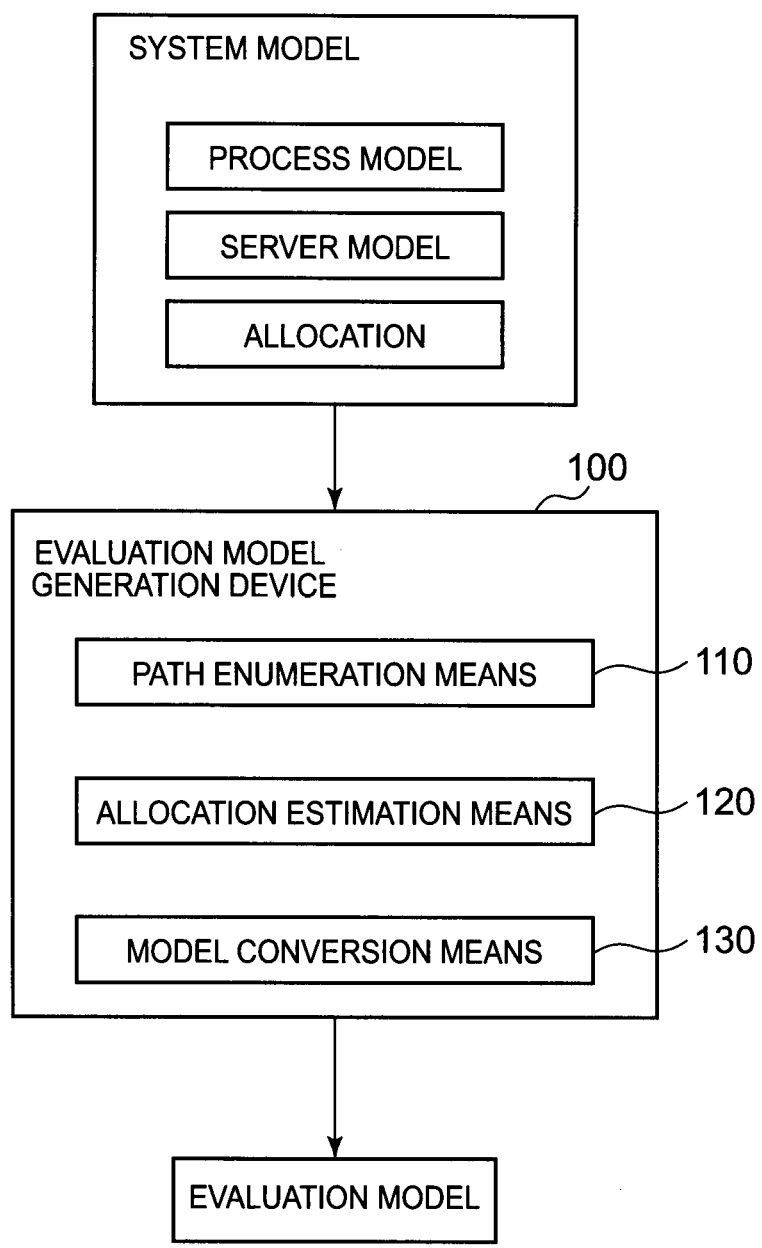
FIG. 1 It depicts a block diagram showing the configuration of an evaluation model generation device as a first exemplary embodiment of this invention.

FIG. 1 is a block diagram showing the configuration of an evaluation model generation device as the first exemplary embodiment of this invention.

As shown in FIG. 1, an evaluation model generation device 100 is information processing equipment made up of path enumeration means 110, allocation estimation means 120, and model conversion means 130. The path enumeration means 110, the allocation estimation means 120, and the model conversion means 130 are implemented typically by the CPU and programs furnished in the evaluation model generation device 100.

As information processing equipment, the evaluation model generation device 100 reads a system model in which the design information about an IT system is modeled, and outputs an evaluation model for evaluating the performance and other aspects of the system in question.

The system model includes a process model representative of the configuration and behavior of software, a server model indicative of the configuration of hardware, and allocations denoting the correspondence relations between the process model and the server model. The system model may be stored either in storage means (not shown) provided in the evaluation model generation device 100 or in a storage device external to the evaluation model generation device 100.

The path enumeration means 110 extracts the paths described in the process model and server model included in the system model.

The allocation estimation means 120 estimates allocations based on the path information extracted by the path enumeration means 110.

The model conversion means 130 converts the system model into the evaluation model based on the information about the system model and on the allocations estimated by the allocation estimation means 120.

Figure 2:
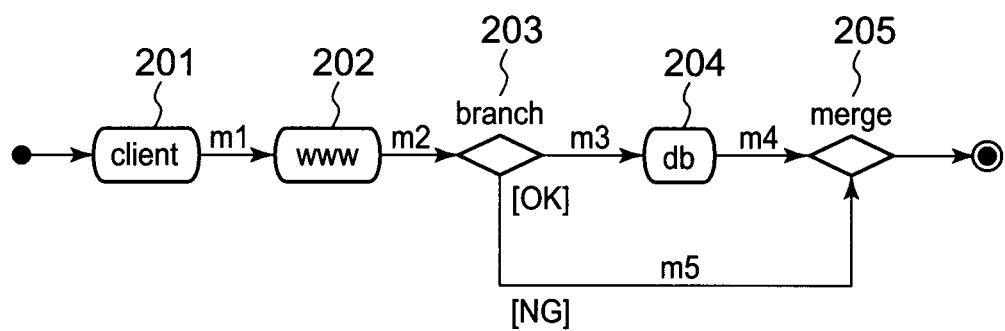
FIG. 2 It depicts an explanatory view showing a typical process model.
Figure 3:
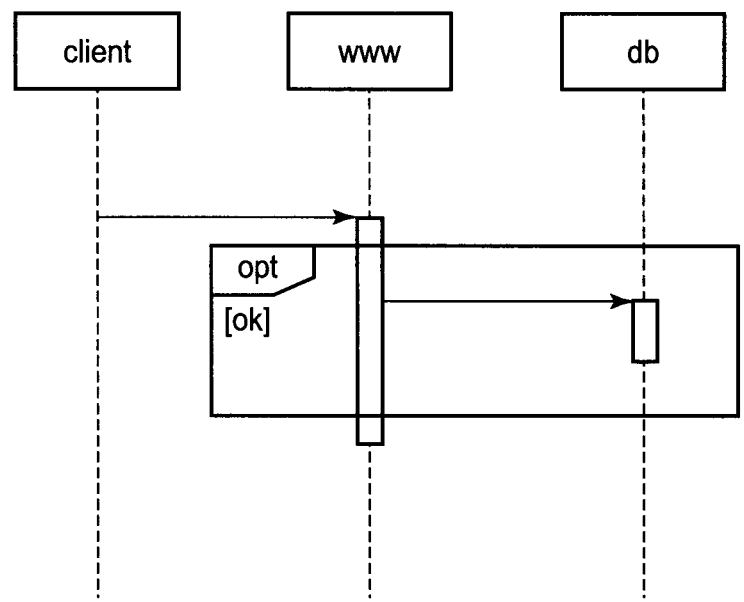
FIG. 3 It depicts an explanatory view showing another typical process model.

FIGS. 2 and 3 are explanatory views showing typical process models.

As shown in FIG. 2, the process model may be expressed in the form of an activity chart or the like in UML. The system shown in FIG. 2 includes three processes "client," "www" and "db," and these processes are shown to be executed in the order of "client" to "www" to "db."

A filled circle shown in FIG. 2 denotes a start node indicative of the start of processing. An encircled filled circle represents an end node indicative of the end of processing. A lozenge "branch" 203 having a plurality of child processes indicates a processing branch, with branch conditions set on arrows. A lozenge "merge" 205 having a plurality of parent processes shows that processing branches are merged there. Rounded rectangles "client" 201, "www" 202, and "db" 204 each represent a single process. Reference characters m1 through m5 denote messages.

The lozenge "branch" 203 indicates that the process "db" 2004 is performed only if the branch condition is met and that otherwise the process "db" 204 is skipped. A description "A→B" in the process model shows that A is a parent of B or B is a child of A.

The process model can be described using a sequence chart such as one shown in FIG. 3. Where the process model is described by use of a sequence chart, a process is carried out to convert that sequence chart into an equivalent activity chart.

Figures 4, 5:
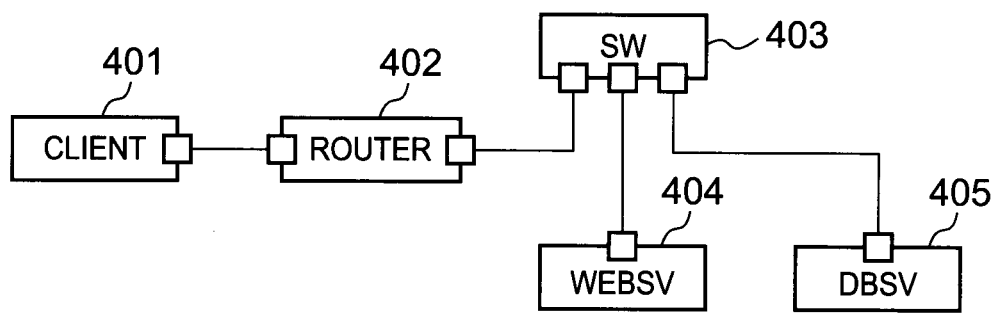
FIG. 4 It depicts an explanatory view showing a typical server model.
FIG. 5 It depicts an explanatory view showing a typical table (allocation table) denoting the correspondence relations between sources of allocation and destinations of allocation.

FIG. 4 is an explanatory view showing a typical server model. The server model is described using a composite configuration plan n UML or an internal block diagram in SysML.

"CLIENT" 401 shown in FIG. 4 stands for a client PC (personal computer), "ROUTER" 402 for a router, "SW" 403 for a network switch, "WEBSV" 404 for a server (web server), and "DBSV" 405 for another server (database server). The lines interconnecting these devices represent network wiring.

FIG. 5 is an explanatory view showing a typical allocation table.

The allocation table shown in FIG. 5 indicates detailed allocations from a process model to a server model. It is shown that the "client" process, "www" process, and "db" process in the process model indicated in FIG. 2 or 3 are carried out respectively by "CLIENT" 401, "WEBSV" 404, and "DBSV" 405 in the server model shown in FIG. 4.

The details shown in FIG. 2 or 3, FIG. 4, and FIG. 5 are described by users such as SE.

The operation of this exemplary embodiment is explained next.

Figure 6:
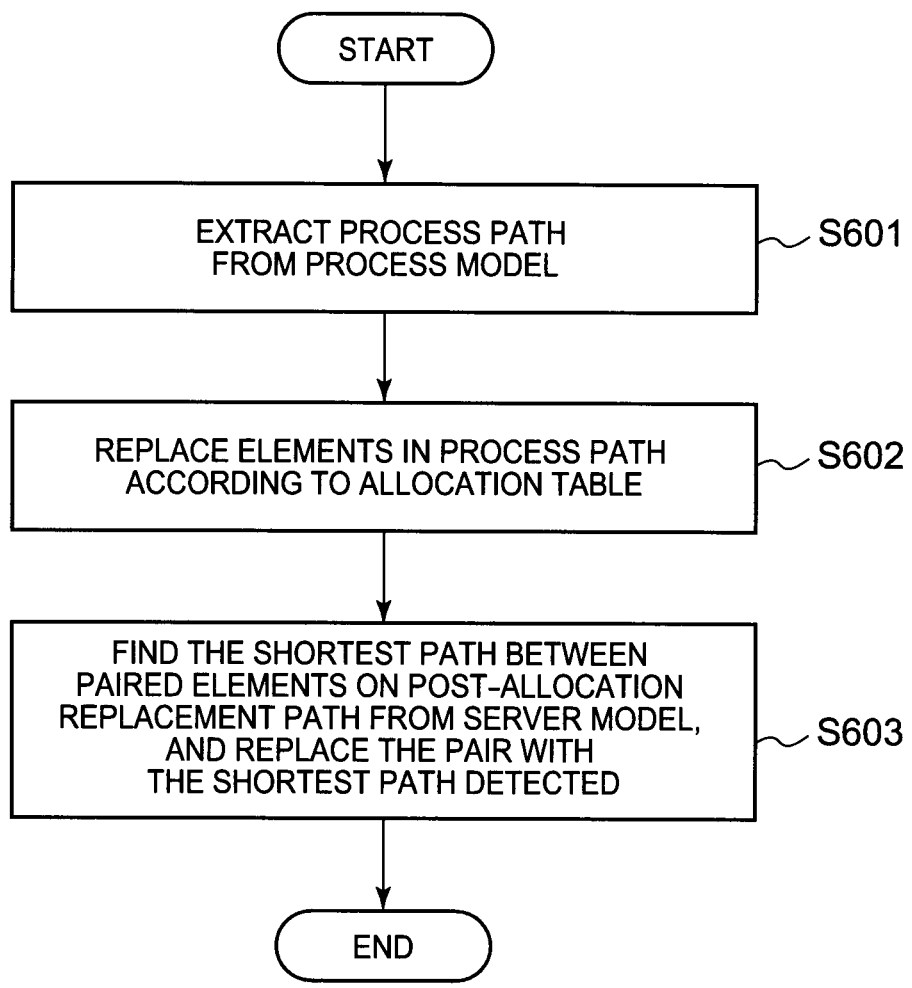
FIG. 6 It depicts a flowchart showing typical processing performed by path enumeration means.

Initially, the evaluation model generation device 100 extracts process paths from the server model by using the path enumeration means 110. FIG. 6 is a flowchart showing typical processing performed by the path enumeration means 110.

The path enumeration means 110 first extracts the paths between elements acting as sources of allocation (called process paths hereunder) from the process model (step S601). In the example shown in FIG. 2, the processes acting as sources of allocation are "client," "www," and "db." Thus the process paths corresponding to these process are "client→m1→www" and "www→m2→branch→m3→db," which are extracted.

Next, the path enumeration means 110 replaces the elements in the process paths according to the allocation table (step S602). The paths following the replacement are called post-allocation paths. For example, the elements "client" and "www" included in the process path "client→m1→www" are replaced with "CLIENT" and "WEBSV" based on the allocation table in FIG. 5. And since the source of allocation "m1" does not have any corresponding destination of allocation in the allocation table, no element is generated corresponding to "m1" in any post-allocation replacement path. As a result, the post-allocation replacement path corresponding to the process path "client→m1→www" is "CLIENT→WEBSV."

Lastly, the path enumeration means 110 searches for the shortest path between the paired elements on the server model in each post-allocation replacement path, and replaces the paired elements with the shortest path detected (step S603). The path following the replacement is called a server path. For example, the post-allocation path "CLIENT→WEBSV" includes "CLIENT" paired with "WEBSV." And the shortest path between these paired elements on the server model is "CLIENT→ROUTER→SW→WEBSV." The search for the shortest path can be implemented using a known breadth-first search algorithm for graphs.

FIG. 7 is an explanatory view showing the correspondence relations between the process paths, post-allocation paths, and server paths extracted in step S601 through step S603.

Next, the evaluation model generation device 100 causes the allocation estimation means 120 to estimate allocations not explicitly designated in the allocation table. The allocation estimation means 120 compares each process path with the corresponding server path to determine which of the elements in the server path corresponds to those elements in the process path not found in the allocation table.

In the example of FIG. 7, the allocation estimation means 120 compares the process path "client→m1→www" with the server path "CLIENT→ROUTER→SW→WEBSV" to estimate the elements corresponding to the element "m1" not found in the allocation table. It is thus estimated that the element "m1" is allocated to the elements "ROUTER" and "SW." FIG. 8 is an explanatory view showing a typical allocation table that also includes the estimated allocations.

Then the evaluation model generation device 100 causes the model conversion means 130 to convert into an evaluation model the system model that includes the estimated allocations. The method of conversion into an evaluation model varies depending on the target to be evaluated. This exemplary embodiment may adopt an example in which the method of conversion into a performance evaluation model is used. The performance evaluation model represents the processing flow on the server model. Furthermore, the performance evaluation model is additionally provided with the attributes necessary for performance evaluation.

Figure 9:
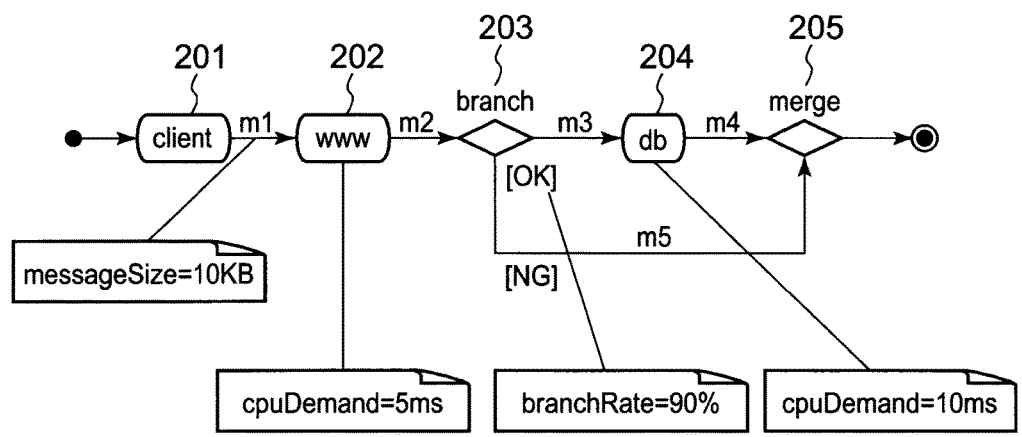
FIG. 9 It depicts an explanatory view of an example in which annotations are added to the process model shown in FIG. 2.
Figure 10:
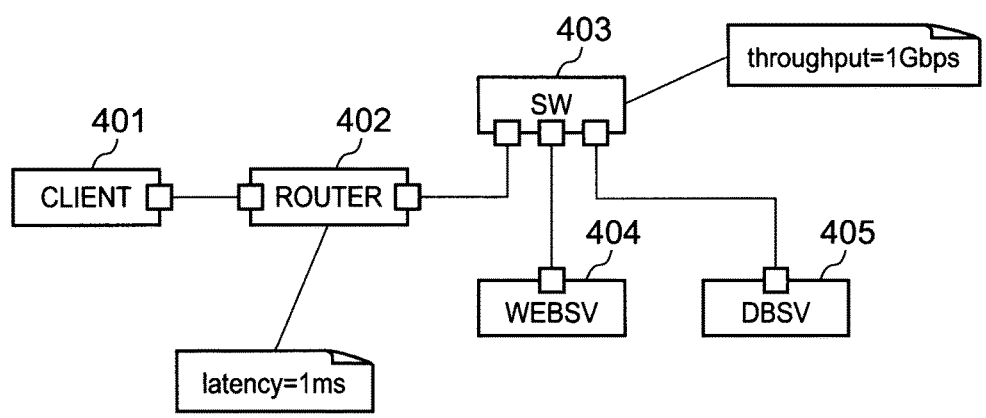
FIG. 10 It depicts an explanatory view of an example in which annotations are added to the server model shown in FIG. 4.

When performance evaluation is performed, each of the elements of the system model is provided in advance with additional information (annotations) for performance evaluation. FIG. 9 is an explanatory view of an example in which the process model shown in FIG. 2 is additionally provided with annotations. FIG. 10 is an explanatory view of an example in which the server model shown in FIG. 4 is additionally provided with annotations. As shown in FIGS. 9 and 10, each of the annotations is shown as a rectangle having a folded corner.

The annotation "message=10 KB" shown in FIG. 9 indicates that the data size of the message m1 in requests transmitted from "client" 201 to "www" 202 is 10 KB on average. The annotation "cpuDemand=5 ms" indicates that the CPU time required for "www" 202 to process the requests is 5 ms on average. The annotation "branchRate=90%" indicates that the probability of branching from "branch" 203 to OK is 90% on average. The annotation "cpuDemand=10 ms" indicates that the CPU time required for "db" 204 to process the requests is 10 ms on average.

The annotation "latency=1 ms" shown in FIG. 10 indicates that a delay of 1 ms on average occurs at "ROUTER" 402. The annotation "throuput=1 Gbps" indicates that the throughput of "SW" 403 is 100 Mbps.

The model conversion means 130 extracts from the process model in FIG. 9 the elements (nodes) which have no parent or of which the parents have all been converted. If there are no such nodes, the processing is terminated.

If the extracted node N is a start node, an end node, a branch node, or a merge node, the model conversion means 130 generates the corresponding start node, end node, branch node, or merge node N'. If the node N has a parent node P, the model conversion means 130 generates a link to the node N' from the node P' resulting from the conversion of the node P.

If the extracted node N is a process node, the model conversion means 130 generates a process node N' corresponding to the node N based on the allocation table. And based on the server path extracted by the path enumeration means 110, the model conversion means 130 examines whether there exists a path to the node N' from a node P' resulting from the conversion of the node P. If there is such a path, the model conversion means 130 generates a node corresponding to the server model element on that path and generates a link between the nodes corresponding to the path.

Then, based on the annotations set on the process model or server model, the model conversion means 130 attaches an attribute value to the generated node in accordance with the rules (1) through (4) given below. It is assumed here that N' denotes the generated node; that R represents the element in the server model that acted as the source from which the node N' was generated; and that Q stands for the element in the process model that acted as the source of allocation of the element R.

(1) The model conversion means 130 attaches an attribute "res=R" to the node N'.

(2) If a "cpuDemand" attribute has been set to the element Q and if the attribute value is "d" seconds, the model conversion means 130 sets an attribute "demand=d" to the generated node N'.

(3) If a "messageSize" attribute is set to the element Q and a "throughput" attribute to the element R, if the value of the "messageSize" attribute is S, and if the value of the "throughput" attribute is X, the model conversion means 130 sets an attribute "demand=S/X" to the generated node N'.

(4) If a "latency" attribute is set to the element R and if the value of the "latency" attribute is "d," the model conversion means 130 sets an attribute "delay=d" to the generated node N'.

If the parent node is a branch node upon generation of a link, the model conversion means 130 sets to the link to be generated a transition probability (branchRate) that has been set as the additional information about the link output from the branch node acting as the source of conversion.

After converting the process model into a performance evaluation model, the model conversion means 130 deletes the process nodes to which neither "demand" nor "delay" has been set.

Figure 11:
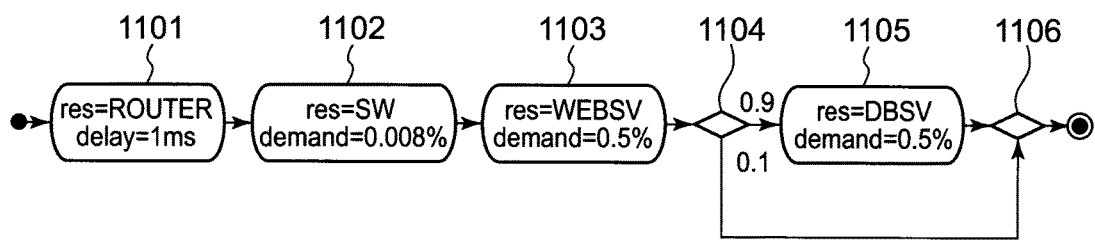
FIG. 11 It depicts an explanatory view showing a typical performance evaluation model generated from the system model shown in FIGS. 8, 9 and 10.

Explained below in reference to FIG. 11 is how a performance evaluation model is generated from the system model shown in FIGS. 8, 9 and 10. FIG. 11 is an explanatory view of a typical performance evaluation model generated from the system model shown in FIGS. 8, 9 and 10.

The model conversion means 130 generates the node corresponding to the destination of allocation "CLIENT" of the process "client" based on the information shown in FIG. 8. Since neither "demand" nor "delay" is set to the node corresponding to "CLIENT" so that the corresponding node will be ultimately deleted, the node is not included in the performance evaluation model shown in FIG. 11.

Next, based on the information shown in FIG. 8, the model conversion means 130 generates a node 1103 corresponding to "WEBSV" that is the destination of allocation of the process "www." Because "ROUTER" and "WS" exist between "CLIENT" and "WEBSV" on the server path shown in FIG. 7, the model conversion means 130 generates, between the node corresponding to "CLIENT" and the node 1103, a node 1101 corresponding to "ROUTER" and a node 1102 corresponding to "SW," and generates links to the nodes 1101, 1102 and 1103, in that order.

Since the element R in the server model that corresponds to the node 1101 is "ROUTER" 402 to which the "latency" attribute of 1 ms has been set, an attribute "delay=1 ms" is set to the node 1101 in accordance with the rule (4) above.

Also, since the element R in the server model that corresponds to the node 1102 is "SW" 403 to which the "throughput" attribute of 1 Gbps (125 MB/s) has been set, and since the element Q in the process model that is the source of allocation of the element R is "m1" to which the "messageSize" attribute has been set, an attribute "demand=0.008%" (=10 KB/125 MB) is set to the node 1102 in accordance with the rule (3) above.

System performance evaluation is thus made possible by simulating the performance evaluation model generated in the manner described above.

With this exemplary embodiment, as explained above, an evaluation model that includes delays of network equipment on the server model is generated by simply describing the allocations between the server and the client as shown in FIG. 5, without regard to the network configuration on the server model. This makes it possible for the user who carries out modeling to suppress the increase in the amount of the allocations described, which reduces the number of man-hours for modeling and diminishes the errors in the results of evaluation caused by mistakes in describing the allocations.

Figure 14:
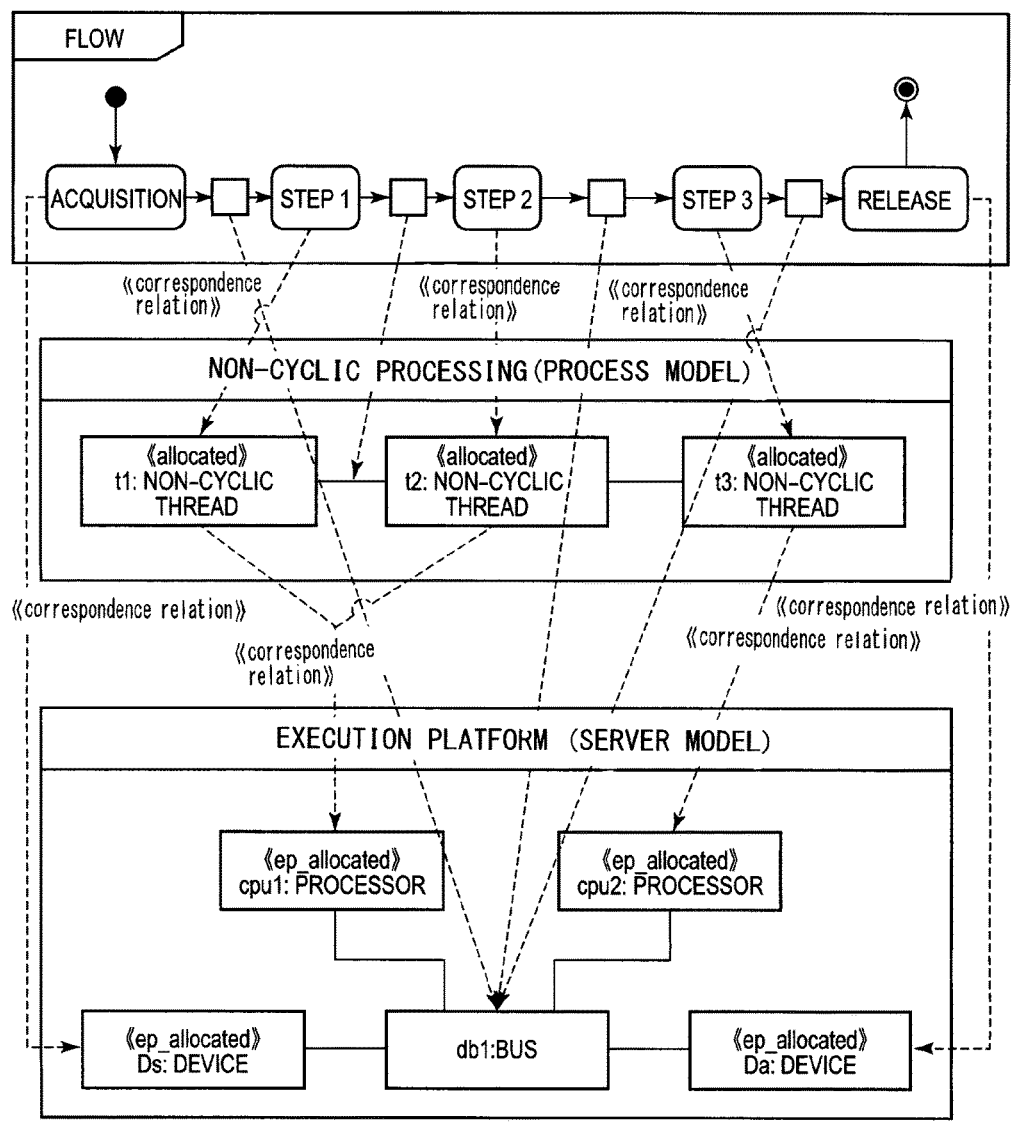
FIG. 14 It depicts an explanatory view showing typical modeling performed by MARIE.

Although the process model with this exemplary embodiment is given only in the form of an activity chart, the process model may also be provided in the form of a model indicative of a structure like the server model, as with the model described as "non-cyclic processing" inside of a rectangle shown in FIG. 14, so that the elements of the model may be allocated to those of the activity chart. In this case, the evaluation model generation device 100 performs the process of temporarily converting the model given as the activity chart into the flow on the process model, and the process of generating the flow on the server model based on the flow on the process model generated by conversion and on the server model.

In addition to modeling the process model and server model on two levels, it is possible to implement multi-level modeling. For example, in order to evaluate a virtual environment, it is possible to perform three-level modeling involving a process model, a virtual sever model, and a physical server model. In this case, too, the model conversion process discussed in connection with this exemplary embodiment may be repeated to effect conversion into the flow on the physical server model for evaluation of performance, etc.

Also with this exemplary embodiment, the control structure of the system model was shown to use examples involving branch processing. Alternatively, the control structure may include parallel processing and repetition processing.

Second Exemplary Embodiment

The second exemplary embodiment of the present invention is explained below in reference to the accompanying drawings.

Figure 12:
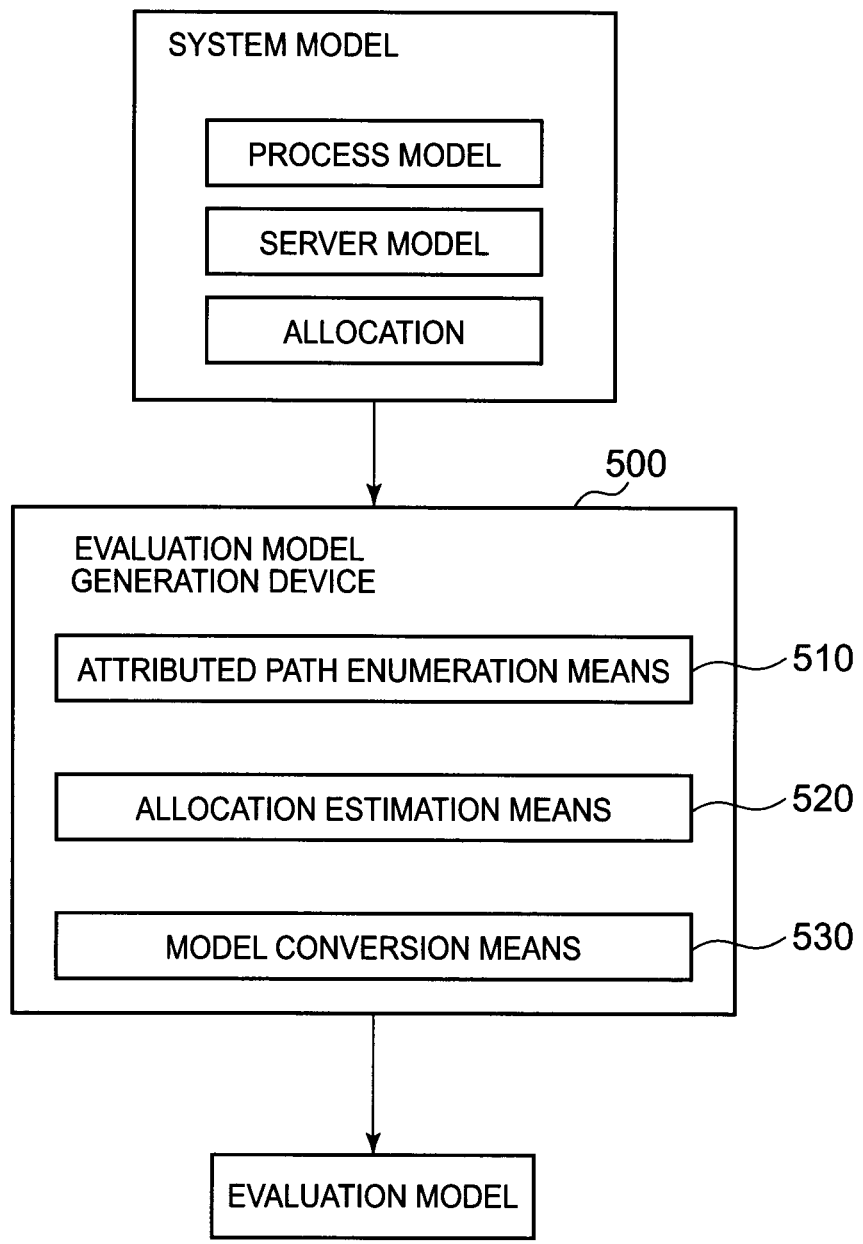
FIG. 12 It depicts a block diagram showing the configuration of an evaluation model generation device as a second exemplary embodiment of this invention.

FIG. 12 is a block diagram showing the configuration of an evaluation model generation device as the second exemplary embodiment of this invention.

As shown in FIG. 12, an evaluation model generation device 500 includes attributed path enumeration means 510, allocation estimation means 520, and model conversion means 530. The attributed path enumeration means 510 can be implemented by the CPU and programs furnished in the evaluation model generation device 500.

The attributed path enumeration means 510 performs the same processing as that of the path enumeration means 110 of the first exemplary embodiment. However, upon search for the shortest path on the server model, the attributed path enumeration means 510 takes into consideration the attributes set to the links on the server model. Specifically, if there exist a plurality of server paths corresponding to a post-allocation replacement path, the attributed path enumeration means 510 searches preferentially for the link having the same attribute as that of the previously extracted server path.

Figure 13:
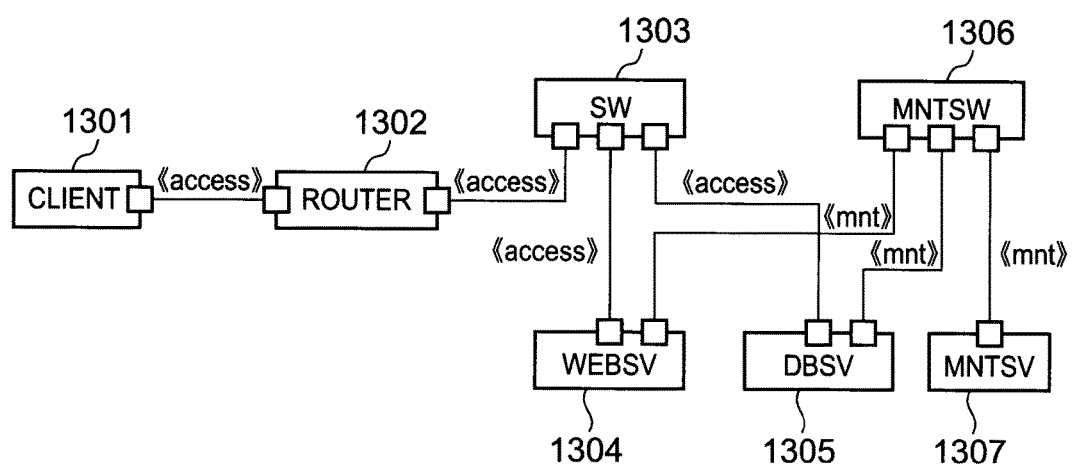
FIG. 13 It depicts an explanatory view of a typical server model in which attributes are added to links.

FIG. 13 is an explanatory view of a typical server model in which attributes are added to links.

"CLIENT" 1301 stands for a client PC, "ROUTER" 1302 for a router, "SW" 1303 for a network switch, "MNTSW" 1306 for another network switch, "WEBSV" 1304 for a server, "DBSV" 1305 for another server, and "MNTSV" 1307 for an operational management server.

In the example shown in FIG. 13, "WEBSV" 1304 and "DBSV" 1305 are connected not only to "CLIENT" 1301 via "SW" 1303 and "ROUTER" 1302 but also to "MNTSV" 1307 via "MNTSW" 1306. And an attribute "<<access>>" is set to the link representing the connection with "CLIENT" 1301. An attribute "<<mnt>>" is set to the link denoting the connection with "MNTSV" 1307.

In the example shown in FIG. 13, there exist two server paths "WEBSV→SW→DBSV" and "WEB-SV→MNTSW→DBSV" corresponding to the post-allocation replacement path "WEBSV→DBSV" in the table shown in FIG. 7.

The attributed path enumeration means 510 extracts the paths having the attribute "<<access>>" of the server path "CLIENT→ROUTER→SW→WEBSV" in the first line of the table shown in FIG. 7. Thus upon search for the server path corresponding to the post-allocation replacement path "WEBSV→DBSV," the attributed path enumeration means 510 determines "WEBSV→SV→DBSV" as the server path in preference to "WEBSV→MNTSW→DBSV" along the link to which a different attribute has been set.

With this exemplary embodiment, where the server is connected to a plurality of networks, search is made for the shortest path on the server model based on the attributes set to the links on the server model.

With the first exemplary embodiment, if the server is connected to a plurality of networks as in the example of FIG. 13, there occurs an ambiguity in making allocations. In order to eliminate the ambiguity, allocations are to be set explicitly. For example, when an allocation to the element "m3" in the process path "www→m2→branch→m3→db" in the example of FIG. 7 is to be estimated, the allocation estimation means 120 is unable to determine whether the destination of allocation is "SW" or "MNTSW." In order to eliminate such ambiguity, an allocation should be set explicitly between "m3" and "SW." With the second exemplary embodiment, the setting of allocations for eliminating ambiguity may be skipped because the attributed path enumeration means 510 searches for the shortest path based on the attribute set to the links on the server model.

Although the present invention has been described in reference to specific exemplary embodiments and examples, such exemplary embodiments and examples are not limitative of this invention. Various changes and modifications that may occur to those skilled in the art may be made to the structures and details of the present invention.

This patent application claims priority to JP-A-2011-132377 filed on Jun. 14, 2011, the entire content of which is hereby incorporated by reference.

REFERENCE SIGNS LIST

110 Path enumeration means
120 Allocation estimation means
130 Model conversion means
100, 500 Evaluation model generation device
201 client
202 www
203 branch
204 db
205 merge
401, 1301 CLIENT
402, 1302 ROUTER
403, 1303 SW
404, 1304 WEBSV
405, 1305 DBSV
510 Attributed path enumeration means
1101-1106 Node
1306 MNTSW
1307 MNTSV

What is claimed is:

1. An evaluation model generation device for generating an evaluation model which evaluates the function or non-function of an IT system based on a system model including a process model which describes processing between processes on the IT system, a server model which describes a physical system configuration of the IT system, and allocations which represent correspondence relations between the elements in the process model and those in the server model, the evaluation model generation device comprising:

a path enumeration unit which extracts a process path between processes in the process model, and a server path corresponding to the process path and located on the server model;

an allocation estimation unit which estimates the allocation based on the process path and the server path; and a model conversion unit which converts the system model into the evaluation model using the process paths, the server paths, and the estimated allocations.

2. The evaluation model generation device according to claim 1, wherein the path enumeration unit in search of a server path searches preferentially for the link having the same attribute as that of the link on the previously extracted server paths based on the attributes attached to links between the elements in the server model.

3. The evaluation model generation device according to claim 2, wherein the path enumeration unit generates a post-allocation replacement path by converting those elements included in the allocations in the process path into elements in the server model based on the allocations, and extracts as the server path on the server model the shortest path between the elements making up the post-allocation replacement path.

4. The evaluation model generation device according to claim 2, wherein when an element in a process path does not exist in an allocation, the allocation estimation unit compares the process path with the server path corresponding to the process path so as to estimate the element in the server path to which the element in the process path corresponds, and provides the allocation additionally with information indicative of the correspondence relations between the element in the process path and the estimated element in the server path.

5. The evaluation model generation device according to claim 2, wherein the model conversion unit sets an attribute value corresponding to additional information set to an element in the process model or server model, to the element in the evaluation model corresponding to the element.

6. The evaluation model generation device according to claim 1, wherein the path enumeration unit generates a post-allocation replacement path by converting those elements included in the allocations in the process path into elements in the server model based on the allocations, and extracts as the server path on the server model the shortest path between the elements making up the post-allocation replacement path.

7. The evaluation model generation device according to claim 6, wherein when an element in a process path does not exist in an allocation, the allocation estimation unit compares the process path with the server path corresponding to the process path so as to estimate the element in the server path to which the element in the process path corresponds, and provides the allocation additionally with information indicative of the correspondence relations between the element in the process path and the estimated element in the server path.

8. The evaluation model generation device according to claim 6, wherein the model conversion unit sets an attribute value corresponding to additional information set to an element in the process model or server model, to the element in the evaluation model corresponding to the element.

9. The evaluation model generation device according to claim 1, wherein when an element in a process path does not exist in an allocation, the allocation estimation unit compares the process path with the server path corresponding to the process path so as to estimate the element in the server path to which the element in the process path corresponds, and provides the allocation additionally with information indicative of the correspondence relations between the element in the process path and the estimated element in the server path.

10. The evaluation model generation device according to claim 9, wherein the model conversion unit sets an attribute value corresponding to additional information set to an element in the process model or server model, to the element in the evaluation model corresponding to the element.

11. The evaluation model generation device according to claim 1, wherein the model conversion unit sets an attribute value corresponding to additional information set to an element in the process model or server model, to the element in the evaluation model corresponding to the element.

12. An evaluation model generation method for generating an evaluation model which evaluates the function or non-function of an IT system based on a system model including a process model which describes processing between processes on the IT system, a server model which describes a physical system configuration of the IT system, and allocations which represent correspondence relations between the elements in the process model and those in the server model, comprising:

extracting a process path between processes in the process model, and a server path corresponding to the process path and located on the server model;

estimating the allocation based on the process path and the server path; and converting the system model into the evaluation model using the process paths, the server paths, and the estimated allocations.

13. The evaluation model generation method according to claim 12, wherein the search is made preferentially for the link having the same attribute as that of the link on the previously extracted server paths based on the attributes attached to links between the elements in the server model when searching of a server path.

14. A non-transitory computer readable information recording medium storing an evaluation model generation program for generating an evaluation model which evaluates the function or non-function of an IT system based on a system model including a process model which describes processing between processes on the IT system, a server model which describes a physical system configuration of the IT system, and allocations which represent correspondence relations between the elements in the process model and those in the server model, which, when executed by a processor, performs a method comprising:

extracting a process path between processes in the process model, and a server path corresponding to the process path and located on the server model;

estimating the allocation based on the process path and the server path; and converting the system model into the evaluation model using the process paths, the server paths, and the estimated allocations.

15. The non-transitory computer readable information recording medium according to claim 14, which, when executed by a processor, performs a method comprising: searching preferentially for the link having the same attribute as that of the link on the previously extracted server paths based on the attributes attached to links between the elements in the server model when searching of a server path.

* * * * *